(12) United States Patent
Ye et al.

(10) Patent No.: US 8,822,105 B2
(45) Date of Patent: Sep. 2, 2014

(54) PHOTOMASK AND METHOD FOR MANUFACTURING THE SAME

(75) Inventors: Dong Ye, Shenzhen (CN); Liang Xu, Shenzhen (CN)

(73) Assignee: Shenzhen China Star Optoelectronics Technology Co. Ltd., Shenzhen (CN)

( * ) Notice: Subject to any disclaimer, the term of this patent is extended or adjusted under 35 U.S.C. 154(b) by 73 days.

(21) Appl. No.: 13/636,699

(22) PCT Filed: Jun. 8, 2012

(86) PCT No.: PCT/CN2012/076644
§ 371 (c)(1),
(2), (4) Date: Sep. 24, 2012

(87) PCT Pub. No.: WO2013/174044
PCT Pub. Date: Nov. 28, 2013

(65) Prior Publication Data
US 2013/0316269 A1    Nov. 28, 2013

(30) Foreign Application Priority Data
May 23, 2012    (CN) .......................... 2012 1 0162265

(51) Int. Cl.
*G03F 1/24*    (2012.01)
(52) U.S. Cl.
USPC ............................................................ 430/5

(58) Field of Classification Search
USPC ........................................ 430/5, 322; 378/35
See application file for complete search history.

(56) References Cited

U.S. PATENT DOCUMENTS

| | | | |
|---|---|---|---|
| 5,905,005 A | 5/1999 | Yabe et al. | |
| 2002/0018941 A1* | 2/2002 | Matsumoto et al. | 430/5 |
| 2004/0063001 A1 | 4/2004 | Wu | |
| 2011/0244378 A1 | 10/2011 | Lin et al. | |

FOREIGN PATENT DOCUMENTS

| | | |
|---|---|---|
| CN | 1658068 | 8/2005 |
| CN | 101196690 | 6/2008 |
| CN | 201611423 | 10/2010 |
| CN | 101995762 | 3/2011 |
| JP | 63-204259 | 8/1988 |
| JP | 4535542 | 6/2010 |
| WO | 2004032204 | 4/2004 |

* cited by examiner

*Primary Examiner* — Stephen Rosasco
(74) *Attorney, Agent, or Firm* — Mark M. Friedman

(57) ABSTRACT

The present invention provides a photo-mask and a method for manufacturing the same. The method for manufacturing the photo-mask comprising: forming a shading pattern layer on a substrate; forming a protecting layer covering the shading pattern layer and the substrate; and; forming a reduced reflection layer on the protecting layer, wherein a refractive index of the protecting layer is greater than a refractive index of the reduced reflection layer. The present invention can mitigate a light reflection problem of a substrate of the conventional photo-mask.

16 Claims, 4 Drawing Sheets

PHOTOMASK AND METHOD FOR MANUFACTURING THE SAME

FIELD OF THE INVENTION

The present invention relates to a photo-mask and a method for manufacturing the same, and more particularly to a photo-mask and a method for manufacturing the same capable of reducing light reflection.

BACKGROUND OF THE INVENTION

Liquid crystal displays (LCDs) have been widely applied in electrical products. Currently, most of LCDs are backlight type LCDs which comprise a liquid crystal panel and a backlight module.

The LCD panel is composed of two transparent substrates and a liquid crystal layer sealed there-between. In an assembly process of the LCD panel, the liquid crystal layer is filled and sealed between the transparent substrates, thereby forming a liquid crystal cell between the two transparent substrates. The liquid crystal cell is sealed by a sealant between two glass substrates, and the sealant there between is cured to form the LCD panel.

In general, the curing for the sealant is performed by an ultraviolet (UV) lighting machine. The UV lighting machine has UV light lamps arranged densely above the LCD panel for emitting UV light, so as to cure the sealant of the LCD panel.

In some specific LCDs, for example, in polymer stabilized vertical alignment (PSVA) type LCDs, reactive monomers are doped and mixed with liquid crystal molecules in the liquid crystal layer between the two transparent substrates, wherein the a polyimide (PI) is coated on a surface of each of the transparent substrates to act as an alignment layer. When applying a voltage and irradiating UV light to the two transparent substrates, a phase separation arises in the reactive monomers and the liquid crystal molecules, and then a polymer is formed on the alignment layers of the transparent substrates. The liquid crystal molecules are oriented along a direction of the polymer due to the interaction between the polymer and the liquid crystal molecules. Therefore, the liquid crystal molecules between the transparent substrates can have a pre-tilt angle.

Since the reactive monomers doped in the liquid crystal layer of the PSVA type LCD may react with the UV light, when curing the sealant of the PSVA type LCD panel, the liquid crystal of PSVA type LCD panel is required to be shaded from the UV light by a photo-mask. However, in general, portions of the UV light will be reflected by a glass substrate of the photo-mask, and thus it is required to increase an irradiating time or light intensity of the UV light.

As a result, it is necessary to provide a photo-mask and a method for manufacturing the same to solve the problems existing in the conventional technologies, as described above.

SUMMARY OF THE INVENTION

The present invention provides a photo-mask and a method for manufacturing the same, so as to light reflection problem of the substrate.

A primary object of the present invention is to provide a photo-mask, and the photo-mask comprises: a substrate; a shading pattern layer formed on the substrate; a protecting layer covering the shading pattern layer and the substrate; and a reduced reflection layer formed on the protecting layer, and a refractive index of the protecting layer is greater than a refractive index of the reduced reflection layer.

Another object of the present invention is to provide a photo-mask, and the photo-mask comprises: a substrate; a shading pattern layer formed on the substrate; a protecting layer covering the shading pattern layer and the substrate; and a reduced reflection layer formed on the protecting layer, and a refractive index of the protecting layer is greater than a refractive index of the reduced reflection layer, and the reduced reflection layer is made of silica, silicon nitride or an organic photo-resist material, and a thickness (d) of the reduced reflection layer satisfies the below equation: $nd=\lambda/4$; wherein n indicates the refractive index of the reduced reflection layer, and $\lambda$ indicates a wavelength of light rays passing through the substrate.

Still another object of the present invention is to provide a method for manufacturing a photo-mask, and the method comprises the following steps: forming a shading pattern layer on a substrate; forming a protecting layer covering the shading pattern layer and the substrate; and forming a reduced reflection layer on the protecting layer, wherein a refractive index of the protecting layer is greater than a refractive index of the reduced reflection layer.

In one embodiment of the present invention, the protecting layer is made of silicon nitride, and the reduced reflection layer is made of silica.

In one embodiment of the present invention, the protecting layer and the reduced reflection layer are made of silicon nitride.

In one embodiment of the present invention, a thickness (d) of the protecting layer satisfies the below equation:

$$nd=\lambda/4;$$

wherein n indicates the protecting layer of the reduced reflection layer, and $\lambda$ indicates a wavelength of light rays passing through the substrate.

In one embodiment of the present invention, a thickness (d) of the reduced reflection layer satisfies the below equation:

$$nd=\lambda/4;$$

wherein n indicates the refractive index of the reduced reflection layer, and $\lambda$ indicates a wavelength of light rays passing through the substrate.

In one embodiment of the present invention, the reduced reflection layer is made of an organic photo-resist material.

In one embodiment of the present invention, the refractive index of the reduced reflection layer is less than 2.

In one embodiment of the present invention, the reduced reflection layer is formed by a plasma-enhanced chemical vapor deposition (PECVD) method.

In one embodiment of the present invention, the protecting layer is made of silicon nitride, and the reduced reflection layer is made of silica.

In one embodiment of the present invention, the protecting layer and the reduced reflection layer are made of silicon nitride.

In one embodiment of the present invention, the reduced reflection layer is made of an organic photo-resist material, and the reduced reflection layer is formed by spin coating.

In comparison with the light reflection problem of the substrate of the conventional photo-mask, with the use of the photo-mask of the present invention and the manufacturing for the same, the light reflection on the substrate of the photo-mask can be reduced for improving a utilization rate of the light rays without increasing the irradiating time or light intensity of the light source. Therefore, when using the photo-mask in the curing process for the sealant of the LCD panel, the curing time for the sealant can be reduced to improve the process efficiency and process yield.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
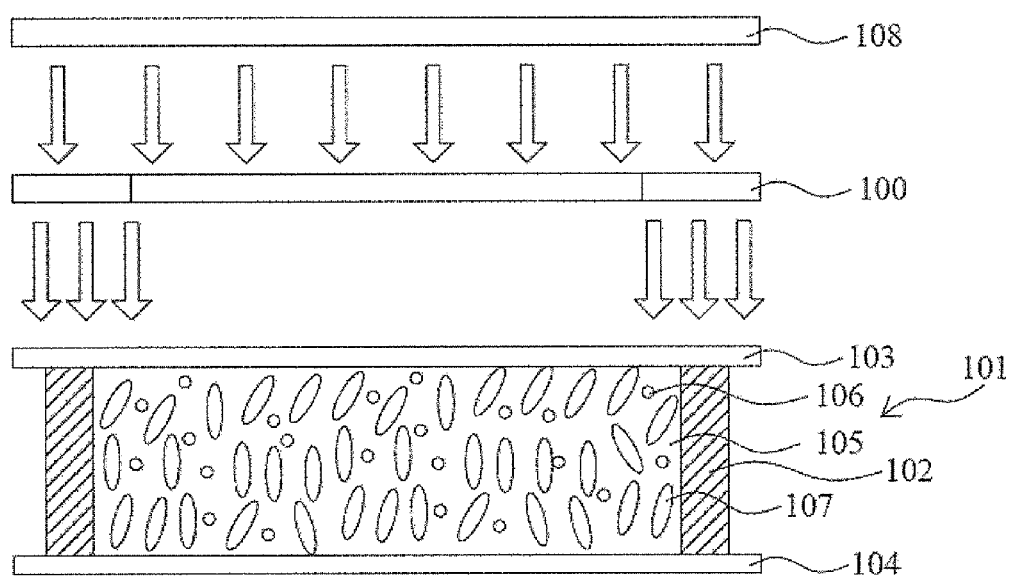
FIG. 1 is a schematic diagram showing a photo-mask used in curing a liquid crystal display (LCD) panel according to a preferred embodiment of the present invention.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, structure-like elements are labeled with like reference numerals.

Referring to FIG. 1, a schematic diagram showing a photo-mask used in curing a liquid crystal display (LCD) panel according to a preferred embodiment of the present invention is illustrated. The LCD panel 101 may comprise a sealant 102, a first substrate 103, a second substrate 104 and a liquid crystal layer 105. The liquid crystal layer 105 is formed between the first substrate 103 and the second substrate 104, and comprises reactive monomers 106 and liquid crystal molecules 107. The reactive monomers 106 are preferably photosensitive monomers mixed with the liquid crystal molecules 107. When curing the sealant 102 of the LCD panel 101, a light source 108, such as a UV lamp, is used to cure the sealant 102, and the liquid crystal layer 105 is shaded by the photo-mask 100, so as to prevent the reactive monomers 106 of the liquid crystal layer 105 from being irradiated by light rays from the light source 108.

Figure 2:
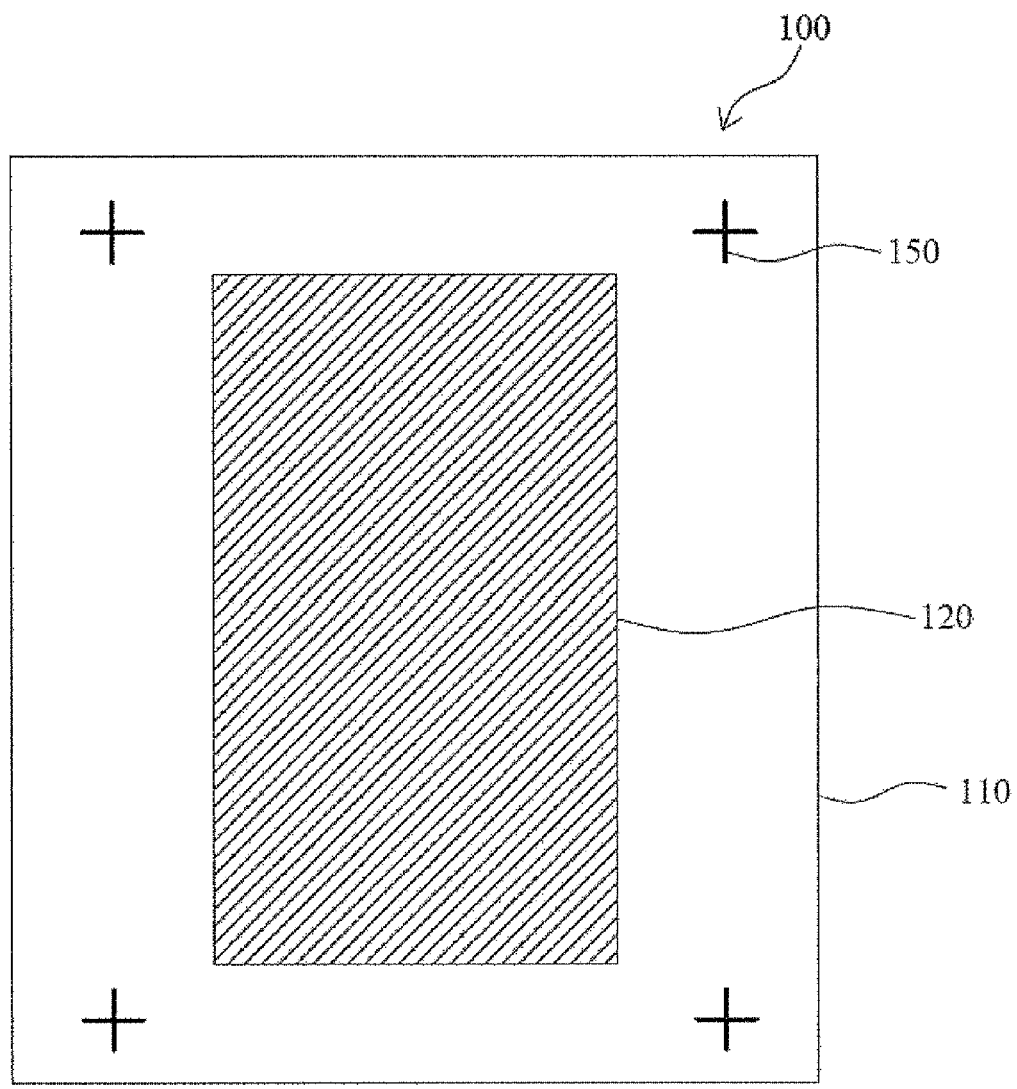
FIG. 2 is a schematic diagram showing the photo-mask according to the preferred embodiment of the present invention.
Figure 3A:
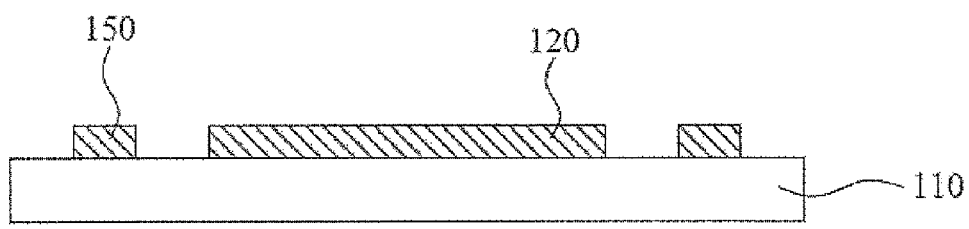
FIG. 3A to FIG. 3C are flow diagrams showing a process for manufacturing the photo-mask according to the preferred embodiment of the present invention.
Figure 3B:
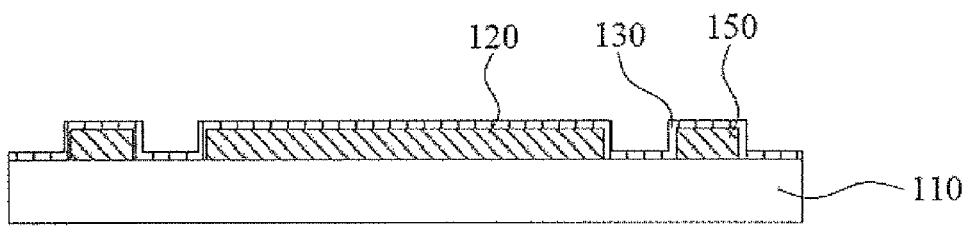
Figure 3C:
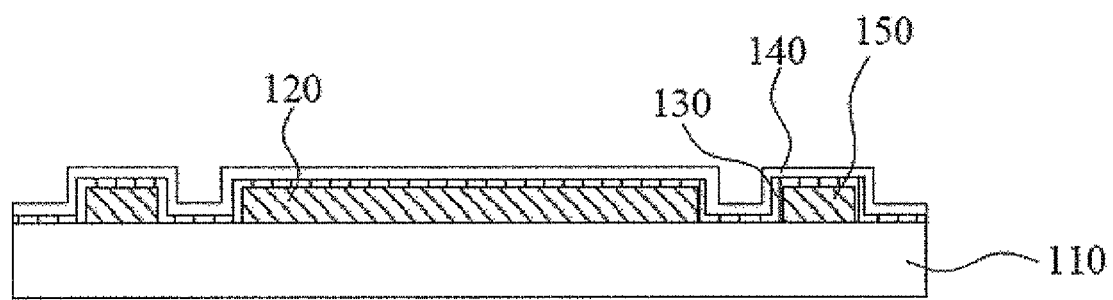

Referring to FIG. 2 and FIG. 3C, schematic diagrams showing the photo-mask according to the preferred embodiment of the present invention are illustrated. The photo-mask 100 comprises a substrate 110, a shading pattern layer 120, a protecting layer 130, a reduced reflection layer 140 and alignment marks 150. The shading pattern layer 120 and the alignment marks 150 are formed on the substrate 110, and the protecting layer 130 covers the shading pattern layer 120, the alignment marks 150 and the substrate 110, and the reduced reflection layer 140 is formed on the protecting layer 130.

Referring to FIG. 1 and FIG. 3C again, the substrate 110 is a transparent substrate, such as a glass substrate or a flexible and plastic substrate. A thickness of the substrate 110 may be less than 1 mm, such as 0.7 mm. The shading pattern layer 120 is configured to shield off the light rays, such as UV light. In this embodiment, a shape and a size of the shading pattern layer 120 is identical to a shape and a size of a region of the liquid crystal layer 105 of the LCD panel 101. The shading pattern layer 120 is preferably made of a metal. The protecting layer 130 is configured to protect the shading pattern layer 120 and the alignment marks 150 from corrosion. The reduced reflection layer 140 is formed on the protecting layer 130 for reducing the reflection of the light rays. The protecting layer 130 and the reduced reflection layer 140 are preferably made of transparent materials. A material of the protecting layer 130 may be silica ($SiO_2$) or silicon nitride ($SiN_x$), and a material of the reduced reflection layer 140 may be silica ($SiO_2$), silicon nitride ($SiN_x$), an organic photo-resist material or other materials. The alignment marks 150 are disposed around the shading pattern layer 120 for aligning the photo-mask 100 and the LCD panel 101 before using the light source 108 to cure the sealant 102. In that manner, the photo-mask 100 can shade the liquid crystal layer 105 from the light rays from the light source 108. The alignment marks 150 are preferably made of a metal.

Referring to FIG. 3A to FIG. 3C, flow diagrams showing a process for manufacturing the photo-mask according to the preferred embodiment of the present invention are illustrated. When manufacturing the photo-mask 100, firstly, referring to FIG. 3A, the shading pattern layer 120 and the alignment marks 150 can be formed on the substrate 110 by coating, exposing, developing, etching and the like. Subsequently, referring to FIG. 3B, the protecting layer 130 can be formed on the shading pattern layer 120, the alignment marks 150 and the substrate 110 by a plasma-enhanced chemical vapor deposition (PECVD) method, so as to protect the shading pattern layer 120 and the alignment marks 150 from corrosion. Subsequently, referring to FIG. 3C, the reduced reflection layer 140 can be formed on the protecting layer 130 by the PECVD method for reducing the reflection of the light rays, so as to reduce the light reflection in a transparent region of the substrate 110.

Therefore, when the light rays pass through the transparent region of the substrate 110, due to the reduced reflection layer 140 capable of reducing the light reflection on the substrate 110, a light transmittance of the photo-mask 100 can be enhanced, so as to reduce the curing time for the sealant 102.

According to a reflection theorem, when the substrate 110 has no coated film thereon, a reflectance $R_0$ can be expressed as follows:

$$R_0 = (n_0 - n_S)^2 / (n_0 + n_S)^2 \qquad (1).$$

In this equation (1), $n_0$ indicates a refractive index of a medium (such as air) on the substrate 110, and $n_S$ indicates a refractive index of the substrate.

According to a multi-layer reflection theorem, when two films are coated on the substrate 110, for zero reflectance on the substrate 110, it is required to satisfy the below equations:

$$n_0 \cdot n_S = n_1 n_2 \qquad (2);$$

$$nd = 1/4\lambda \qquad (3);$$

$$R = [(n_0 - (n_1^2/n_2^2) \cdot n_S)/(n_0 + (n_1^2/n_2^2) \cdot n_S)]^2 \qquad (4).$$

In the above-mentioned equations, $n_S$ indicates the refractive index of the substrate 110, and $n_2$ and $n_1$ indicate refractive indexes of the protecting layer 130 and the reduced reflection layer 140 stacked on the substrate 110 in sequence, and n and d indicate a refractive index and a thickness of the protecting layer 130 or the reduced reflection layer 140 on the substrate, and λ indicates a wavelength of the light rays passing through the substrate 110.

In accordance with the above-mentioned equations (2)~(4), when the refractive index $n_1$ is less than the refractive index $n_2$ ($n_1 < n_2$), the surface reflectance R of the substrate 110 having the protecting layer 130 or the reduced reflection layer 140 thereon can be less than $R_0$ (i.e. $R<R_0$). Therefore, by controlling the refractive indexes of the protecting layer 130 and the reduced reflection layer 140 stacked on the substrate 110, the reflection of the light rays of a specific wavelength on the substrate 110 can be efficiently reduced. In this embodiment, the reduced reflection layer 140 is formed on the protecting layer 130, and the refractive index $n_1$ of the protecting layer 130 is greater than the refractive index $n_2$ of the reduced reflection layer 140 for reducing the reflection of the light rays on the substrate 110 as well as improving a utilization rate of the light rays.

In one embodiment, when the refractive index $n_1$ of the protecting layer 130 is greater than the refractive index $n_2$ of the reduced reflection layer 140, the protecting layer 130 may be made of silicon nitride ($SiN_x$), and the reduced reflection layer 140 may be made of silica ($SiO_2$).

In one embodiment, when the protecting layer 130 and the reduced reflection layer 140 are both made of silicon nitride ($SiN_x$), a process parameter (such as a ratio of N/Si) of the PECVD method for manufacturing the same can be adjusted, so as to adjust a refractive index of the silicon nitride for ensuring that the refractive index $n_1$ of the protecting layer 130 is greater than the refractive index $n_2$ of the reduced reflection layer 140.

In one embodiment, the thickness of the protecting layer 130 or the reduced reflection layer 140 can satisfy the above-mentioned equation (3), so as to reduce the reflection of the light rays of a specific wavelength (such as 365 nm) on the substrate 110.

In one embodiment, the reduced reflection layer 140 can be made of an organic photo-resist material. At this time, the reduced reflection layer 140 can be formed by spin coating for reducing a complexity of the manufacturing process. In this case, the refractive index of the reduced reflection layer 140 can be less than 2, such as 1.56.

As described above, with the use of the photo-mask 100 of the present invention and the manufacturing for the same, the light reflection on the substrate 110 of the photo-mask 100 can be reduced for improving a utilization rate of the light rays without increasing the irradiating time or light intensity of the light source. Therefore, when using the photo-mask 100 in the curing process for the sealant 102 of the LCD panel 101, the curing time for the sealant 102 can be reduced to improve the process efficiency and process yield.

In this embodiment, the photo-mask 100 of the present invention is applicable to cure the sealant 102 of the LCD panel 101. Certainly, in other embodiments, the photo-mask 100 of the present invention may be applicable to manufacture other electronic devices or products.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A photo-mask, comprising:
   a substrate;
   a shading pattern layer formed on the substrate;
   a protecting layer covering the shading pattern layer and the substrate; and
   a reduced reflection layer formed on the protecting layer, and a refractive index of the protecting layer is greater than a refractive index of the reduced reflection layer, and the reduced reflection layer is made of silica, silicon nitride or an organic photo-resist material, and a thickness (d) of the reduced reflection layer satisfies the below equation:

$nd=\lambda/4$;

wherein n indicates the refractive index of the reduced reflection layer, and $\lambda$ indicates a wavelength of light rays passing through the substrate.

2. The photo-mask according to claim 1, wherein the protecting layer is made of silicon nitride, and the reduced reflection layer is made of silica.

3. The photo-mask according to claim 1, wherein the protecting layer and the reduced reflection layer are made of silicon nitride.

4. The photo-mask according to claim 1, wherein a thickness (d) of the protecting layer satisfies the below equation:

$nd=\lambda/4$;

wherein n indicates the protecting layer of the reduced reflection layer, and $\lambda$ indicates a wavelength of light rays passing through the substrate.

5. The photo-mask according to claim 1, wherein the reduced reflection layer is made of the organic photo-resist material, and the refractive index of the reduced reflection layer is less than 2.

6. A photo-mask, comprising:
   a substrate;
   a shading pattern layer formed on the substrate;
   a protecting layer covering the shading pattern layer and the substrate; and;
   a reduced reflection layer formed on the protecting layer, and a refractive index of the protecting layer is greater than a refractive index of the reduced reflection layer, and a thickness (d) of the reduced reflection layer satisfies the below equation:

$nd=\lambda/4$;

wherein n indicates the refractive index of the reduced reflection layer, and $\lambda$ indicates a wavelength of light rays passing through the substrate.

7. The photo-mask according to claim 6, wherein the protecting layer is made of silicon nitride, and the reduced reflection layer is made of silica.

8. The photo-mask according to claim 6, wherein the protecting layer and the reduced reflection layer are made of silicon nitride.

9. The photo-mask according to claim 6, wherein a thickness (d) of the protecting layer satisfies the below equation:

$nd=\lambda/4$;

wherein n indicates the protecting layer of the reduced reflection layer, and $\lambda$ indicates a wavelength of light rays passing through the substrate.

10. The photo-mask according to claim 6, wherein the refractive index of the reduced reflection layer is less than 2.

11. A method for manufacturing a photo-mask, comprising:
    forming a shading pattern layer on a substrate;
    forming a protecting layer covering the shading pattern layer and the substrate; and;
    forming a reduced reflection layer on the protecting layer, wherein a refractive index of the protecting layer is greater than a refractive index of the reduced reflection layer, and a thickness (d) of the reduced reflection layer satisfies the equation below:

$nd=\lambda/4$;

wherein n indicates the refractive index of the reduced reflection layer, and λ indicates a wavelength of light rays passing through the substrate.

12. The method according to claim 11, wherein the reduced reflection layer is formed by a plasma-enhanced chemical vapor deposition (PECVD) method.

13. The method according to claim 12, wherein the protecting layer is made of silicon nitride, and the reduced reflection layer is made of silica.

14. The method according to claim 12, wherein the protecting layer and the reduced reflection layer are made of silicon nitride.

15. The method according to claim 11, wherein the reduced reflection layer is made of an organic photo-resist material, and the reduced reflection layer is formed by spin coating.

16. The method according to claim 11, wherein a thickness (d) of the protecting layer satisfies the below equation:

$$nd=\lambda/4;$$

wherein n indicates the protecting layer of the reduced reflection layer, and λ indicates a wavelength of light rays passing through the substrate.

* * * * *